(12) United States Patent  
Wright

(10) Patent No.: US 10,076,062 B2  
(45) Date of Patent: Sep. 11, 2018

(54) AUDIO AMPLIFIER

(71) Applicant: Nicholas Heath Wright, Killen, TX (US)

(72) Inventor: Nicholas Heath Wright, Killen, TX (US)

( * ) Notice: Subject to any disclaimer, the term of this patent is extended or adjusted under 35 U.S.C. 154(b) by 12 days.

(21) Appl. No.: 14/291,080

(22) Filed: May 30, 2014

(65) Prior Publication Data

US 2015/0349714 A1    Dec. 3, 2015

(51) Int. Cl.
*H03F 99/00*    (2009.01)
*H05K 7/20*    (2006.01)

(52) U.S. Cl.
CPC ..... *H05K 7/20445* (2013.01); *H05K 7/20409* (2013.01)

(58) Field of Classification Search
CPC .............. H03F 3/68; H03F 1/00; H04R 5/04
USPC .................................... 381/28, 120
See application file for complete search history.

(56) References Cited

U.S. PATENT DOCUMENTS

| | | | | |
|---|---|---|---|---|
| 3,601,661 A * | 8/1971 | Kleinhample | ..... | H05K 7/20545 361/714 |
| 4,414,604 A * | 11/1983 | Matsui | ..... | H05K 7/20 165/104.11 |
| 6,144,556 A * | 11/2000 | Lanclos | ..... | H05K 7/20145 361/695 |
| 6,201,700 B1 * | 3/2001 | Tzinares | ..... | H05K 7/20854 165/185 |
| 6,307,530 B1 * | 10/2001 | Cho | ..... | G02F 1/13452 345/87 |
| 2013/0328466 A1 * | 12/2013 | Chang | ..... | G06F 1/181 312/236 |

\* cited by examiner

*Primary Examiner* — Ahmad F Matar
*Assistant Examiner* — Sabrina Diaz
(74) *Attorney, Agent, or Firm* — Dunlap Bennett & Ludwig PLLC

(57) ABSTRACT

A amplifier with improved space efficiency includes a housing that dissipates heat having an upper wall and two side walls and having an interior with upper and lower portions. The amplifier further includes an upper circuit board in the upper portion and a lower circuit board in a lower portion. The amplifier further includes a connector that electrically connects the upper and lower circuit boards.

10 Claims, 3 Drawing Sheets

AUDIO AMPLIFIER

TECHNICAL FIELD

The apparatus described herein relates to the field of audio electronics, more particularly, to the field of audio amplifiers.

BACKGROUND

Audio amplifiers (or amps) are a necessary component of any sound system. A quiet source signal (such as those produced by mp3 players, cd players, tuners, and phonographs) must be amplified significantly to drive a speaker to produce sounds over 100 decibels.

Amps must distribute large amounts of power, and generate significant heat as a result. For this reason, amps frequently have heat dissipation systems integrated into their chassis. Although heat dissipation is an issue for rack or cabinet amps, it presents even greater challenges in portable amplifiers.

Portable amps are needed in any application where portability is desired—however, they are most frequently seen in automotive sound system applications. Factory automobile sound systems come with a head unit with a built-in amp and speakers. These components are typically of low quality, with the head unit amp producing 10 watts per channel or less. This results in poor sound quality, limited volume capability, distortion, and frequent speaker blowouts. Aftermarket head units are better, and have built-in amps typically producing around 20 watts per channel. However, if a motorist wants a sound system capable of truly high volume that is not prone to damaging expensive aftermarket speakers, they must opt for a standalone amp which can generate 100 watts per channel or more.

These portable amps are typically located in the trunk of the vehicle, and are typically mounted to the floor of the trunk. They take up significant space and need to be specially designed to not overheat or generate hot spots that will damage other objects in the trunk. They must also be rugged enough to withstand the g-forces, jarring, and collisions with objects that they will endure in an automotive environment. Furthermore, since the trunk has limited floor space (particularly if other audio equipment is present), a user is usually limited to one amp at most.

There remains a need in the art for a portable amplifier that takes up less trunk space (particularly in a footprint dimension) while remaining durable, powerful, and having excellent heat management.

BRIEF SUMMARY

A amplifier with improved space efficiency includes a housing that dissipates heat having an upper wall and two side walls and having an interior with upper and lower portions. The amplifier further includes an upper circuit board in the upper portion and a lower circuit board in a lower portion. The amplifier further includes a connector that electrically connects the upper and lower circuit boards.

In some embodiments, the amplifier includes a divider coupled to the side walls that separates an interior of said housing into upper and lower compartments and the upper circuit board is in the upper compartment and the lower circuit board is in the lower compartment. In some embodiments, the divider is thermally coupled to the side walls. In some embodiments, the upper compartment contains audio circuitry and the lower compartment contains power supply circuitry. In some embodiments, the circuit boards are coupled to the side walls. In some embodiments, the amplifier further includes slots in the side walls that engage the circuit boards to couple them to the side walls. In some embodiments, the housing has fins on its exterior that dissipate heat. In some embodiments, the amplifier includes end plates at either end of the housing. In some embodiments, the amplifier includes power supply ports on one of the end plates. In some embodiments, the upper circuit board is thermally coupled to the upper wall and the lower circuit board is thermally coupled to the divider. In some embodiments, the amplifier further includes transistors thermally coupled to the side walls. In some embodiments, the amplifier further includes clip slots in the side walls and clips that couple the transistors to the clip slots. In some embodiments, the transistors are located in the upper and lower compartments beneath the upper and lower circuit boards. In some embodiments, the divider mechanically braces the housing to protect the circuit boards from mechanical strain.

DETAILED DESCRIPTION

Figure 1:
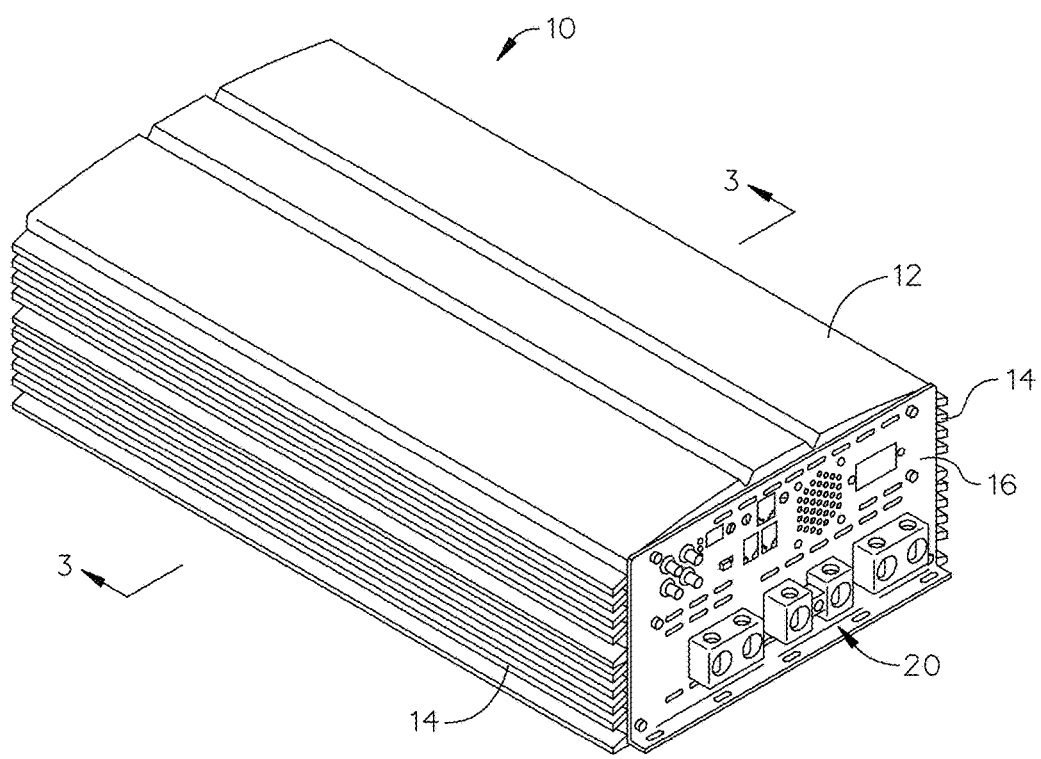
FIG. 1 is an angled isometric view from above one embodiment of the apparatus.

As shown in FIG. 1, amplifier 10 includes a housing 12 that dissipates heat generated by the internal electronics. In this embodiment, housing 12 has fins 14 on its exterior that help it dissipate heat. In this embodiment, amplifier 10 also includes a front end plate 16 with ports 20 that electrically connect amplifier 10 to a power source and other audio components.

Figure 2:
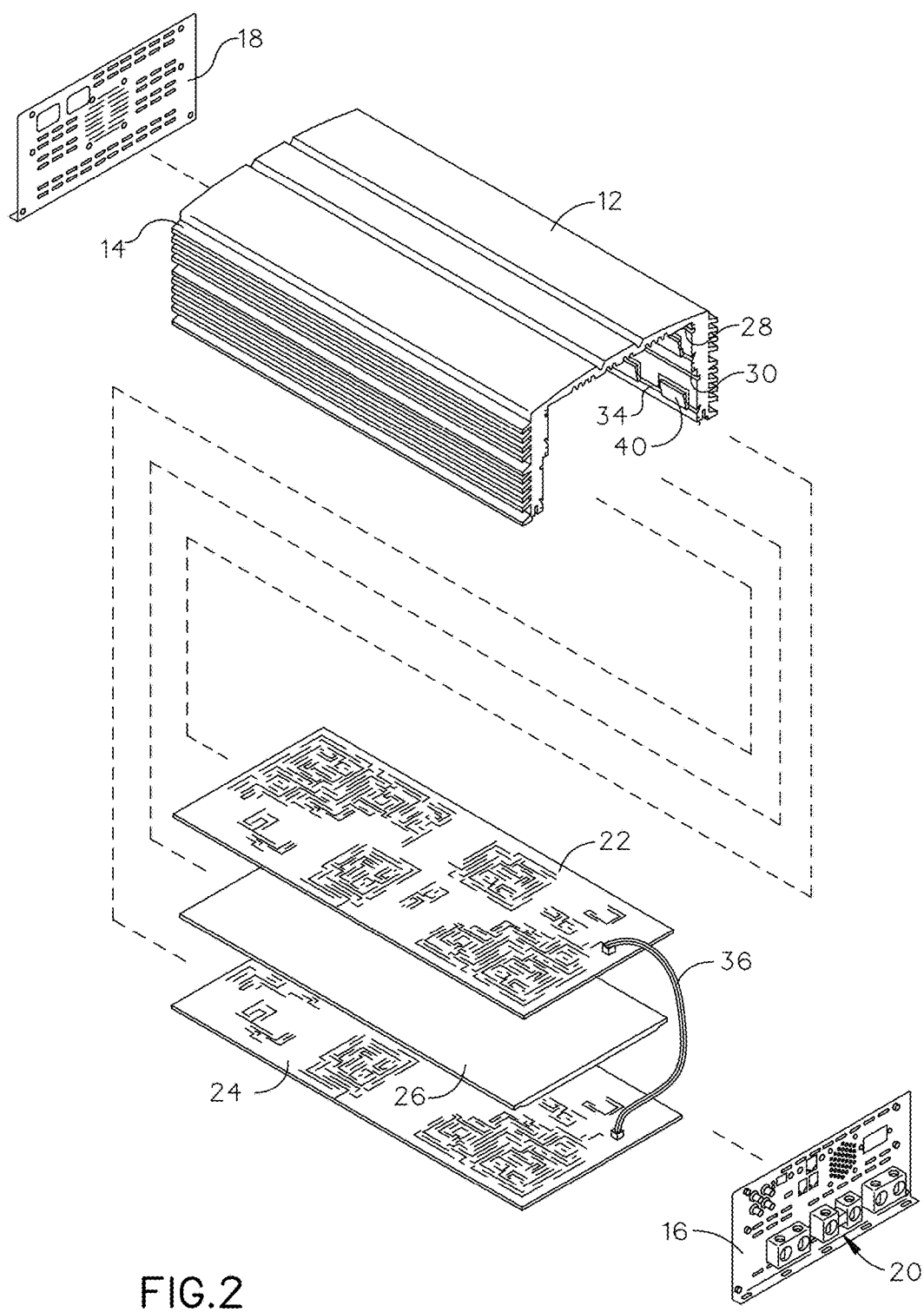
FIG. 2 is a disassembled angled isometric view from above the embodiment shown in FIG. 1.

FIG. 2 is a disassembled view of the amplifier shown in FIG. 1, showing its internal components. In this embodiment, amplifier 10 has a rear end plate or control panel 18. As can be seen in FIG. 2, housing 12 is shaped like an upside-down "U", having an upper wall, a first side wall and a second side wall. The first side wall and the second side wall each include an inner surface, an outer surface, a proximal end extending from the upper wall and a distal end. The side walls comprise upper circuit board slots 28, lower circuit board slots 30 and lower clip slots 34. Upper circuit board 22 is coupled to housing 12 via upper circuit board slots 28. Lower circuit board 24 is coupled to housing 12 via lower circuit board slots 30. Upper circuit board 22 and lower circuit board 24 may be of any design, including printed circuit boards. Moreover, upper circuit board 22 and lower circuit board 24 may be coupled to the sidewalls, upper wall, or divider 26 by means other than upper circuit board slots 28 and lower circuit board slots 30.

Divider 26 is within the interior of the housing coupled to the inner surfaces of the first sidewall and the second sidewall above the distal ends and below the proximal ends and divides the interior of housing 12 into upper and lower compartments. Upper circuit board 22 is in the upper compartment and lower circuit board 24 is in the lower compartment. In some embodiments, the power supply circuitry is on one circuit board, while the audio circuitry is on the other. This separation of the circuit boards allows for efficient heat dissipation while reducing the footprint of amplifier 10, resulting in a taller, narrower housing. As a result of having a more square profile, amplifier 10 has a lower surface to volume ratio than a typical flat amplifier. As a result, it will have less contact with the atmosphere and reduced ability to dissipate heat without further design considerations, such as those explained herein.

Figure 3:
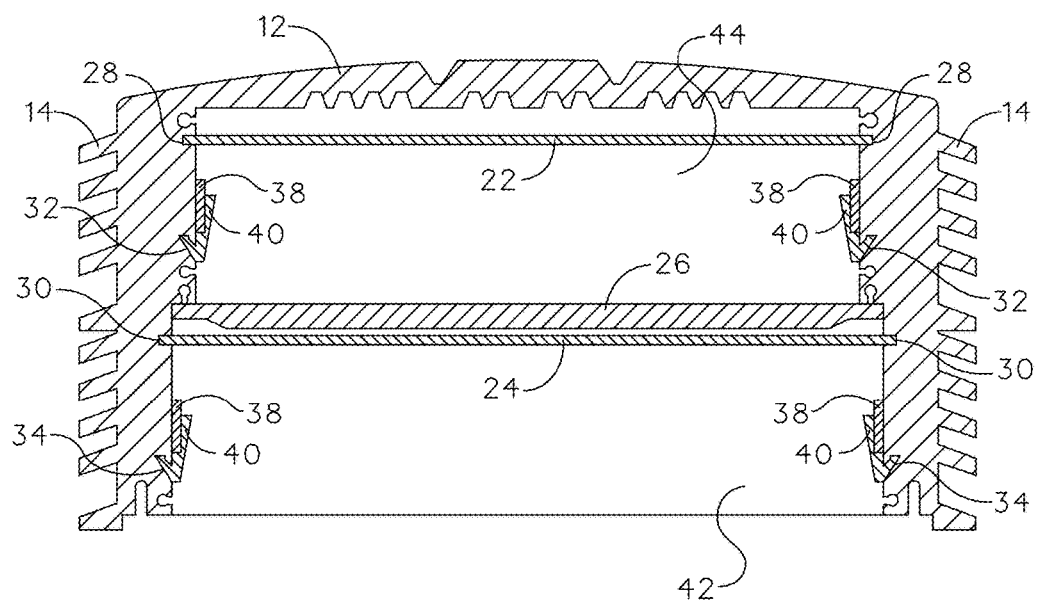
FIG. 3 is a sectional front planar view of the embodiment shown in FIG. 1 from direction 3 in FIG. 1.

In order to accomplish the separation of upper and lower circuitry, lower circuit board 24 may be thermally coupled to divider 26, which may be a heat sink or have other heat dissipation properties. Upper circuit board may be thermally coupled to the upper wall of housing 12, which may have heat dissipation properties, such as indentations or other surface-area enhancing features as shown in FIG. 3. Furthermore, an electrical cable 36 electrically connects upper circuit board 22 to lower circuit board 24. This allows the power supply circuitry to supply power to the audio circuitry, or allows the routing of audio signals to the power supply board. An electrical cable 36 is used in this embodiment, however a different type of electrical connector may be used.

FIG. 3 is a sectional view of amplifier 10 shown in FIG. 1 from direction 3 in FIG. 1. Here it can be seen that upper circuit board 22 is in close proximity to the upper wall of housing 12, allowing it to transfer heat to the upper wall. Lower circuit board 24 is in close proximity to divider 26, allowing it to transfer heat to divider 26. Divider 26 may be thermally coupled to the side walls of housing 12, allowing it to transfer heat from lower circuit board 24 to housing 12, which will in turn transfer the heat to the surrounding atmosphere. As can be seen in FIG. 3, divider 26 divides the interior of housing 12 into upper compartment 44 and lower compartment 42. Divider 26 also mechanically strengthens amplifier 10 and protects circuit boards 22, 24 from stress, strain, and vibrations. Circuit boards 22, 24 may contain fragile components such as MOS-FETs which may break if subjected to stress, strain, or vibrations. Divider 26 acts as a mechanical brace to transfer these forces away from circuit boards 22, 24. In this embodiment, upper compartment 44 contains audio circuitry, and lower compartment 42 contains power supply circuitry. However, this configuration may be reversed.

Both power supply circuitry and audio circuitry may require large transistors that are distinct components from circuit boards 22,24. As shown in FIG. 3, transistors 38 are both mechanically and thermally coupled to the side walls of housing 12. Thus, any heat they generate will be transferred to the side walls, which feature fins 14 that aid in the transfer of heat to the atmosphere. Upper compartment 44 has upper clip slots 32 in the sidewalls of housing 12. Upper clip slots 32 couple clips 40 to the side walls, which allows clips 40 to couple transistors 38 to the side walls. Lower clip slots 34 in lower compartment 42 function in a similar manner. However, other mounting systems besides clips 40 and clip slots 32,34 may be used to couple transistors 38 to the sidewalls of housing 12. Moreover, additional components such as thermal grease may be used to thermally couple the various components to divider 26 or housing 12.

As a result of the stacked configuration of housing 12 with upper compartment 44 and lower compartment 42, the footprint and overall size of amplifier 10 is reduced. Having a reduced footprint is particularly advantageous because the amps are usually floor-mounted, so a user will be able to install the amp in a compact vehicle or other area where conventional amps cannot be installed. Moreover, a user may be able to install more amps in a vehicle or area than would otherwise be possible with conventional amps using the same amount of floor space. As a result, their sound system can have more power.

Because of the design with divider 26, amplifier 10 is capable of cooling all of the necessary circuitry despite its reduced footprint and reduced surface to volume ratio. Finally, since the audio and power supply circuitry can be separated, this allows easier connections between amplifiers without interference from the power supply circuitry. For example amplifier 10 may be connected in a linear fashion to another amplifier 10 of similar design.

Although the invention has been described with reference to embodiments herein, those embodiments do not limit the invention. Modifications to those embodiments or other embodiments may fall within the scope of the invention.

What is claimed is:

1. An amplifier with improved space efficiency, comprising:
    a housing that dissipates heat having an upper wall, a first side wall and a second side wall, and an interior, wherein the first side wall and the second side wall each comprise an inner surface, an outer surface, a proximal end extending from the upper wall and a distal end;
    a divider that dissipates heat and is within the interior of the housing coupled to the inner surfaces of the first sidewall and the second sidewall above the distal ends and below the proximal ends mechanically strengthening the amplifier and separating the interior of the housing into an upper compartment and a lower compartment disposed above and below one another;
    an upper circuit board in the upper compartment between the upper wall and the divider, wherein the upper circuit board is in close proximity to the upper wall allowing heat to transfer from the upper circuit board to the upper wall;
    a lower circuit board in the lower compartment beneath the divider, wherein the lower circuit board is in close proximity to the divider allowing heat to transfer from the lower circuit board to the divider; and
    a connector that electrically connects the upper and lower circuit boards, wherein
    the upper circuit board comprises one of an audio circuitry and a power supply circuitry and the lower circuit board comprises the other of the audio circuitry and the power supply circuitry.

2. The amplifier of claim 1, wherein the upper circuit board comprises the audio circuitry and the lower circuit board comprises the power supply circuitry.

3. The amplifier of claim 1, wherein the circuit boards are coupled to the first side wall and the second side wall.

4. The amplifier of claim 3, further comprising:
    slots in the first side wall and the second side wall that engage the circuit boards to couple them to the first side wall and the second side wall.

5. The amplifier of claim 1, wherein the housing has fins on its exterior that dissipate heat.

6. The amplifier of claim 1, further comprising:
    end plates at a front end and a rear end of the housing.

7. The amplifier of claim 6, further comprising:
    power supply ports on one of the end plates.

8. The amplifier of claim 1, further comprising:
    transistors thermally coupled to the inner surface of at least one of the first side wall and the second side wall.

9. The amplifier of claim 8, further comprising:
    clip slots in the first side wall and the second side wall; and
    clips that couple the transistors to the clip slots.

10. The amplifier of claim 8, wherein the transistors are located in the upper and lower compartments beneath the upper and lower circuit boards.

\* \* \* \* \*

UNITED STATES PATENT AND TRADEMARK OFFICE
CERTIFICATE OF CORRECTION

PATENT NO. : 10,076,062 B2
APPLICATION NO. : 14/291080
DATED : September 11, 2018
INVENTOR(S) : Nicholas Heath Wright Page 1 of 1

It is certified that error appears in the above-identified patent and that said Letters Patent is hereby corrected as shown below:

On the Title Page

Items (71) and (72), should read as follows:
Applicant: Nicholas Heath Wright, Killen, AL (US)
Inventor: Nicholas Heath Wright, Killen, AL (US)

Signed and Sealed this
Fourth Day of December, 2018

Andrei Iancu
*Director of the United States Patent and Trademark Office*